United States Patent
Zou et al.

(10) Patent No.: US 9,590,165 B2
(45) Date of Patent: Mar. 7, 2017

(54) ACOUSTIC RESONATOR COMPRISING ALUMINUM SCANDIUM NITRIDE AND TEMPERATURE COMPENSATION FEATURE

(71) Applicant: Avago Technologies General IP (Singapore) Pte. Ltd., Singapore (SG)

(72) Inventors: Qiang Zou, Fort Collins, CO (US); Chris Feng, Fort Collins, CO (US); Phil Nikkel, Loveland, CO (US); Kevin J. Grannen, Thornton, CO (US); Tangshiun Yeh, Fort Collins, CO (US); Dariusz Burak, Fort Collins, CO (US); John Choy, Westminster, CO (US); Tina L. Lamers, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 301 days.

(21) Appl. No.: 14/194,074

(22) Filed: Feb. 28, 2014

(65) Prior Publication Data

US 2014/0175950 A1    Jun. 26, 2014

Related U.S. Application Data

(63) Continuation-in-part of application No. 14/092,026, filed on Nov. 27, 2013, now Pat. No. 9,490,770, and
(Continued)

(51) Int. Cl.
*H01L 41/09* (2006.01)
*H01L 41/187* (2006.01)
(Continued)

(52) U.S. Cl.
CPC ..... *H01L 41/0805* (2013.01); *H03H 9/02102* (2013.01); *H03H 9/131* (2013.01); *H03H 9/173* (2013.01)

(58) Field of Classification Search
USPC .......................... 310/311–371; 333/186–197; 252/62.9 PZ, 62.9 R; 501/134
See application file for complete search history.

(56) References Cited

U.S. PATENT DOCUMENTS

| 4,456,850 A | 6/1984 | Inoue et al. |
| 5,587,620 A | 12/1996 | Ruby et al. |

(Continued)

FOREIGN PATENT DOCUMENTS

| CN | 1171382 | 10/2004 |
| JP | 60-16010 | 1/1985 |

(Continued)

OTHER PUBLICATIONS

Akiyama et al., Enhancement of Piezoelectric Response in "Scandium Aluminum Nitride Alloy Thin Films Prepared by Dual Reactive Cosputtering", 2009, Advanced Materials, 2009, 21, pp. 593-596.*

(Continued)

Primary Examiner — Thomas Dougherty

(57) ABSTRACT

An acoustic resonator structure comprises a first electrode disposed on a substrate, a piezoelectric layer disposed on the first electrode and comprising aluminum scandium nitride, a second electrode disposed on the piezoelectric layer, and a temperature compensation feature having a temperature coefficient offsetting at least a portion of a temperature coefficient of the piezoelectric layer, the first electrode, and the second electrode.

23 Claims, 8 Drawing Sheets

Related U.S. Application Data a continuation-in-part of application No. 14/092,793, filed on Nov. 27, 2013, and a continuation-in-part of application No. 14/092,077, filed on Nov. 27, 2013, now Pat. No. 9,490,418, and a continuation-in-part of application No. 13/955,774, filed on Jul. 31, 2013, now Pat. No. 9,246,473, and a continuation-in-part of application No. 13/781,491, filed on Feb. 28, 2013, now Pat. No. 9,490,771, and a continuation-in-part of application No. 13/663,449, filed on Oct. 29, 2012, now Pat. No. 9,401,692, and a continuation-in-part of application No. 13/208,883, filed on Aug. 12, 2011, now Pat. No. 9,083,302, and a continuation-in-part of application No. 13/074,262, filed on Mar. 29, 2011, now Pat. No. 9,136,818, and a continuation-in-part of application No. 13/766,993, filed on Feb. 14, 2013, now Pat. No. 9,444,426, and a continuation-in-part of application No. 13/660,941, filed on Oct. 25, 2012, now Pat. No. 9,425,764, and a continuation-in-part of application No. 13/767,754, filed on Feb. 14, 2013, now Pat. No. 9,484,882.

(51) Int. Cl.
  *H01L 41/047* (2006.01)
  *H01L 41/08* (2006.01)
  *H03H 9/17* (2006.01)
  *H03H 9/02* (2006.01)
  *H03H 9/13* (2006.01)

(56) References Cited

U.S. PATENT DOCUMENTS

| | | |
|---|---|---|
| 5,873,153 A | 2/1999 | Ruby et al. |
| 6,107,721 A | 8/2000 | Lakin |
| 6,230,378 B1 * | 5/2001 | Cramer .................. H01L 41/083 29/25.35 |
| 6,291,931 B1 | 9/2001 | Lakin |
| 6,384,697 B1 | 5/2002 | Ruby |
| 6,396,200 B2 | 5/2002 | Misu et al. |
| 6,420,820 B1 | 7/2002 | Larson, III |
| 6,424,237 B1 | 7/2002 | Ruby et al. |
| 6,476,536 B1 | 11/2002 | Pensala |
| 6,507,983 B1 | 1/2003 | Ruby et al. |
| 6,548,943 B2 | 4/2003 | Kaitila et al. |
| 6,617,751 B2 | 9/2003 | Sunwoo et al. |
| 6,864,619 B2 | 3/2005 | Aigner et al. |
| 6,985,051 B2 | 1/2006 | Nguyen et al. |
| 7,233,218 B2 | 6/2007 | Park et al. |
| 7,275,292 B2 | 10/2007 | Ruby et al. |
| 7,280,007 B2 | 10/2007 | Feng et al. |
| 7,345,410 B2 | 3/2008 | Grannen et al. |
| 7,358,831 B2 | 4/2008 | Larson et al. |
| 7,369,013 B2 | 5/2008 | Fazzio et al. |
| 7,388,454 B2 | 6/2008 | Ruby et al. |
| 7,435,613 B2 | 10/2008 | Barber |
| 7,466,213 B2 | 12/2008 | Lobl et al. |
| 7,468,608 B2 | 12/2008 | Feucht et al. |
| 7,486,213 B2 | 2/2009 | Yu et al. |
| 7,491,569 B2 | 2/2009 | Fattinger |
| 7,616,079 B2 | 11/2009 | Tikka et al. |
| 7,629,865 B2 | 12/2009 | Ruby |
| 7,636,026 B2 | 12/2009 | Heinze et al. |
| 7,657,983 B2 | 2/2010 | Aigner |
| 7,758,979 B2 | 7/2010 | Akiyama et al. |
| 7,889,024 B2 | 2/2011 | Bradley et al. |
| 7,893,793 B2 | 2/2011 | Iwasaki et al. |
| 7,966,722 B2 | 6/2011 | Hart et al. |
| 7,986,198 B2 | 7/2011 | Nakatsuka et al. |
| 8,008,993 B2 | 8/2011 | Milsom et al. |
| 8,030,823 B2 | 10/2011 | Sinha et al. |
| 8,222,795 B2 | 7/2012 | Sinha et al. |
| 8,253,513 B2 | 8/2012 | Zhang |
| 8,330,325 B1 | 12/2012 | Burak et al. |
| 8,456,257 B1 | 6/2013 | Fattinger |
| 8,575,820 B2 | 11/2013 | Shirakawa et al. |
| 2002/0153965 A1 | 10/2002 | Ruby et al. |
| 2003/0227357 A1 | 12/2003 | Metzger et al. |
| 2004/0046622 A1 | 3/2004 | Aigner et al. |
| 2005/0110598 A1 | 5/2005 | Larson, III et al. |
| 2005/0151600 A1 | 7/2005 | Takeuchi et al. |
| 2005/0206479 A1 | 9/2005 | Nguyen et al. |
| 2007/0205850 A1 | 9/2007 | Jamneala et al. |
| 2008/0042780 A1 | 2/2008 | Lee et al. |
| 2008/0129414 A1 | 6/2008 | Lobl et al. |
| 2008/0258842 A1 | 10/2008 | Ruby et al. |
| 2009/0102319 A1 | 4/2009 | Nakatsuka et al. |
| 2009/0127978 A1 | 5/2009 | Asai et al. |
| 2009/0267457 A1 | 10/2009 | Barber et al. |
| 2010/0033063 A1 | 2/2010 | Nishihara et al. |
| 2010/0091370 A1 | 4/2010 | Mahrt et al. |
| 2010/0107389 A1 | 5/2010 | Nessler et al. |
| 2010/0187948 A1 | 7/2010 | Sinha et al. |
| 2010/0327697 A1 | 12/2010 | Choy et al. |
| 2010/0327994 A1 | 12/2010 | Choy et al. |
| 2011/0037539 A1 | 2/2011 | Jansman et al. |
| 2011/0084779 A1 | 4/2011 | Zhang |
| 2011/0121916 A1 | 5/2011 | Barber et al. |
| 2011/0148547 A1 | 6/2011 | Zhang |
| 2011/0204996 A1 | 8/2011 | Gilbert et al. |
| 2011/0227671 A1 | 9/2011 | Zhang |
| 2011/0266925 A1 | 11/2011 | Ruby et al. |
| 2012/0177816 A1 | 7/2012 | Larson et al. |
| 2012/0218058 A1 | 8/2012 | Burak et al. |
| 2012/0218059 A1 | 8/2012 | Burak et al. |
| 2012/0218060 A1 | 8/2012 | Burak et al. |
| 2012/0274647 A1 | 11/2012 | Lan et al. |
| 2012/0280767 A1 | 11/2012 | Burak et al. |
| 2013/0033151 A1 | 2/2013 | Ueda et al. |
| 2013/0038408 A1 | 2/2013 | Burak et al. |
| 2013/0049545 A1 | 2/2013 | Zou et al. |
| 2013/0082799 A1 | 4/2013 | Zuo et al. |
| 2013/0106243 A1 | 5/2013 | Reinhardt et al. |
| 2013/0106534 A1 | 5/2013 | Burak et al. |
| 2013/0127300 A1 | 5/2013 | Umeda et al. |
| 2013/0205586 A1 | 8/2013 | Takada et al. |
| 2013/0235001 A1 | 9/2013 | Yun et al. |
| 2013/0241673 A1 | 9/2013 | Yokoyama et al. |
| 2013/0314177 A1 | 11/2013 | Burak et al. |
| 2014/0111288 A1 | 4/2014 | Nikkel et al. |
| 2014/0118088 A1 | 5/2014 | Burak et al. |
| 2014/0118089 A1 | 5/2014 | Bradley et al. |
| 2014/0118090 A1 | 5/2014 | Grannen et al. |
| 2014/0118091 A1 | 5/2014 | Burak et al. |
| 2014/0118092 A1 | 5/2014 | Burak et al. |
| 2014/0152152 A1 | 6/2014 | Burak et al. |
| 2014/0159548 A1 | 6/2014 | Burak et al. |
| 2014/0175950 A1 | 6/2014 | Zou et al. |
| 2014/0225683 A1 | 8/2014 | Burak et al. |
| 2014/0232486 A1 | 8/2014 | Burak et al. |
| 2014/0340172 A1 | 11/2014 | Bradley et al. |

FOREIGN PATENT DOCUMENTS

| | | | |
|---|---|---|---|
| JP | 2000-514278 | 10/2000 | |
| JP | 2006-186412 | 7/2006 | |
| JP | 2007-208845 | 8/2007 | |
| JP | 2008-131194 | 6/2008 | |
| JP | 2008-211394 | 9/2008 | |
| JP | 2009-010926 A * | 1/2009 | ............ H01L 41/08 |
| JP | 4471443 | 6/2010 | |
| WO | 2007085332 | 8/2007 | |

OTHER PUBLICATIONS

Yanagitani et al., "Giant shear mode electromechanical coupling coefficient k15 in c-axis tilted ScAlN films", no date given, National Institute of Advanced Industrial Scienct and Technology, four pages, not numbered.*

(56) References Cited

OTHER PUBLICATIONS

Zou, et al. "High Coupling Coefficient Temperature Compensated FBAR Resonator for Oscillator Application with Wide Pulling Range", 2010 IEEE International Frequency Control Symposium (FCS), Jun. 1-4, 2010, pp. 646-651 and one page IEEE Xplore Abstract.
Zhang, et al. "MIMO Multiplexer Based on Film Bulk Acoustic Resonator"; IEEE Transactions on Consumer Electronics, vol. 56, No. 2, May 2010, pp. 805-810.
"U.S. Appl. No. 13/232,334, filed Sep. 14, 2011".
"U.S. Appl. No. 13/660,941, filed Oct. 25, 2012".
"Co-pending U.S. Appl. No. 13/662,425, filed Oct. 27, 2012".
"Co-pending U.S. Appl. No. 13, Oct. 18, 2012".
"Co-pending U.S. Appl. No. 13/654,718, filed Oct. 18, 2012".
"Co-pending U.S. Appl. No. 13/658,024, filed Oct. 23, 2012".
"Co-pending U.S. Appl. No. 13/660,941, filed Oct. 25, 2012".
"Co-pending U.S. Appl. No. 13/662,460, filed Oct. 27, 2012".
"Co-pending U.S. Appl. No. 13/663,449, filed Oct. 29, 2012".
"Co-pending U.S. Appl. No. 13/766,993, filed Feb. 14, 2013".
"Co-pending U.S. Appl. No. 13/767,754, filed Feb. 14, 2013".
"Co-pending U.S. Appl. No. 13/781,491, filed Feb. 28, 2013".
"Co-pending U.S. Appl. No. 13/955,744, filed Jul. 31, 2015".
Aigner, "SAW, BAW and The Future of Wireless", May 6, 2013, pp. 1-4, May 6, 2013.
Archibald, "Experimental Results of Bulk Acoustic Wave Transverse Graded Electrode Patterns", Proceedings of the 1998 IEEE International Frequency Control Symposium, 1998, 477-483.
El Hassan, et al., "Techniques for Tuning BAW-SMR Resonators for the 4th Generation of Mobile Communications", Intech, 2013, 421-442.
Kerherve, "BAW Technologies for Radiofrequency Filters and Duplexers", Nov. 2011.
Lin, "Temperature Compensation of Aluminum Nitride Lamb Wave Resonators Utilizing The Lowest-Order Symmetric Mode", Electrical Engineering and Computer Sciences University of California At Berkeley, Dec. 14, 2012.
Pandey, et al., "Anchor Loss Reduction in Resonant MEMS using MESA Structures", Proceedings of the 2nd IEEE International Conference on Nano/Micro Engineered and Molecular Systems, Bangkok, Thailand, Jan. 16-19, 2007, 880-885.
Pensala, "Thin Film Bulk Acoustic Wave Devices: Performance Optimization and Modeling", VTT Publications 756, http://www.vtt.fi/inf/pdf/publications/2011/P756.pdf, 1-108.
Pineda, "Thin-Film Bulk Acoustic Wave Resonators—FBAR", Bellaterra, Monpelier, Dec. 2007, 1-241.
Tang, et al., "Micromachined Bulk Acoustic Resonator With a Raised Frame", 16th International Conference on Mechatronics Technology, Oct. 16-19, 2012, Tianjin, China, Oct. 16-19, 2012.
Tas, et al., "Reducing Anchor Loss in Micromechanical Extensional Mode Resonators", IEEE Transactions on Ultrasonics, Ferroelectrics and Frequency Control, vol. 57, No. 2., Feb. 2010, 448-454.
"IEEE Xplore Abstract for Suppression of Acoustic Energy Leakage in FBARS with Al Bottom Electrode: FEM Simulation and Experimental Results", Oct. 25-31, 2007, 2 pages.
"Machine Translation of JP 2007-208845", Aug. 16, 2007, 1-9.
"Machine Translation of JP 2008-211394", Sep. 11, 2008, 1-8.
Ohara, et al., "Suppression of Acoustic Energy Leakage in FBARs with Al Bottom Electrode: FEM Simulation and Experimental Results", 2007 IEEE Ultrasonics Symposium Oct. 28-31, 2007, 1657-1660.
Office Action dated Jun. 3, 2016 in Chinese Application No. 201310446558.8 (Unofficial/non-certified translation provided by foreign agent included).
English language abstract of CN1171382, published Oct. 13, 2004.
English language abstract of JP2000-514278, published Oct. 24, 2000.
English language machine translation of JP2006-186412, published Jul. 13, 2006, 9 pages.

\* cited by examiner

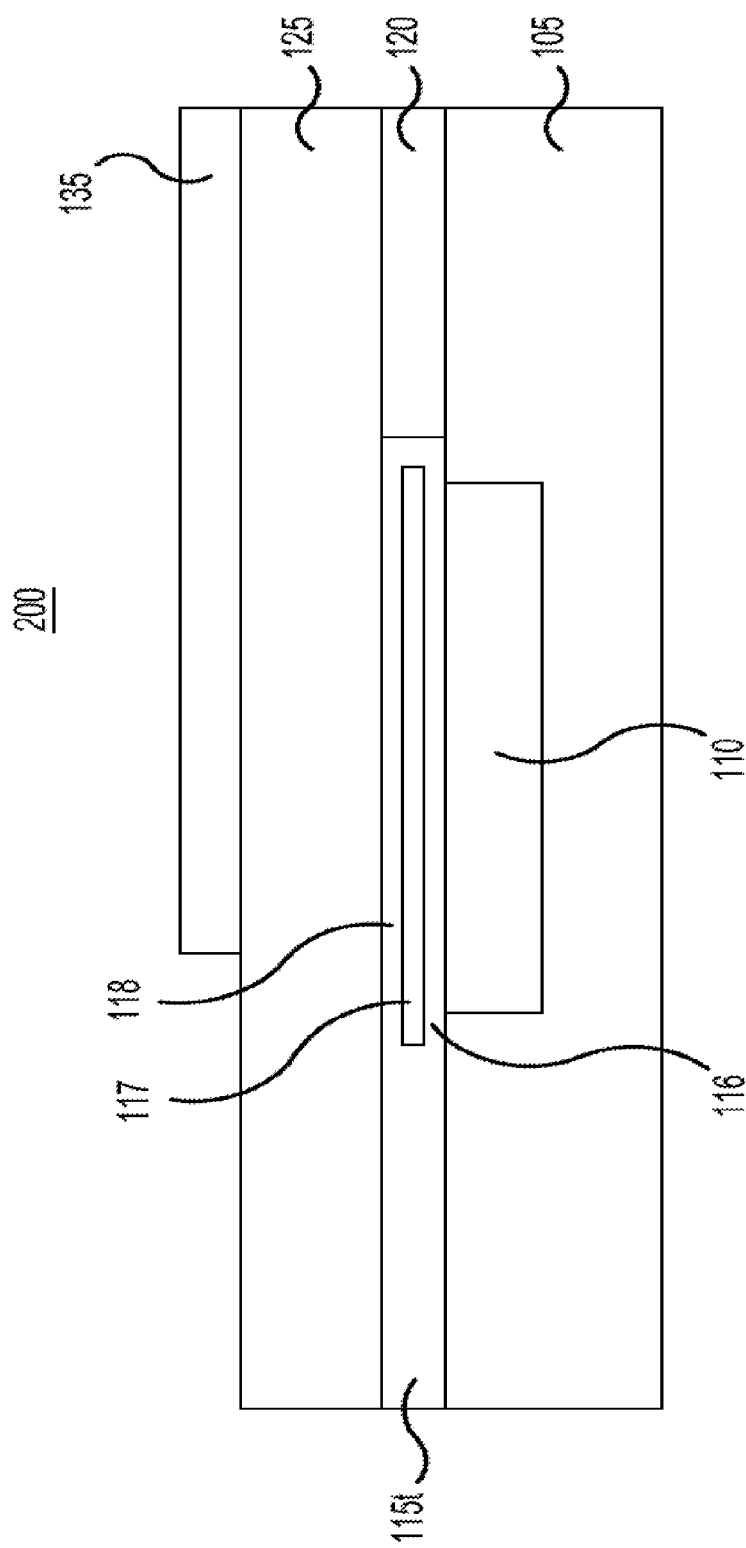

ACOUSTIC RESONATOR COMPRISING ALUMINUM SCANDIUM NITRIDE AND TEMPERATURE COMPENSATION FEATURE

CROSS REFERENCE TO RELATED APPLICATIONS

This application is a continuation-in-part under 37 C.F.R. §1.53(b) of commonly owned U.S. patent application Ser. No. 14/092,026 filed Nov. 27, 2013, Ser. No. 14/092,793 filed Nov. 27, 2013, and Ser. No. 14/092,077 filed Nov. 27, 2013, each of which is a continuation-in-part under 37 C.F.R. §1.53(b) of commonly owned U.S. patent application Ser. No. 13/955,774 filed on Jul. 31, 2013, which is a continuation-in-part of commonly owned U.S. patent application Ser. No. 13/781,491 filed on Feb. 28, 2013, which is a continuation-in-part of commonly owned U.S. patent application Ser. No. 13/663,449 filed on Oct. 29, 2012, which are hereby incorporated by reference in their entireties. U.S. patent application Ser. No. 13/955,774 is also a continuation-in-part under 37 C.F.R. §1.53(b) of commonly owned U.S. patent application Ser. No. 13/208,883 filed on Aug. 12, 2011, which is a continuation-in-part application of commonly owned U.S. patent application Ser. No. 13/074,262 filed on Mar. 29, 2011, which are hereby incorporated by reference in their entireties. U.S. patent application Ser. No. 14/092,793 is also a continuation-in-part under 37 C.F.R. §1.53(b) of commonly owned U.S. patent application Ser. No. 13/766,993 filed on Feb. 14, 2013, which is a continuation-in-part under 37 C.F.R. §1.53(b) of U.S. patent application Ser. No. 13/660,941 filed on Oct. 25, 2012, which are hereby incorporated by reference in their entireties. U.S. patent application Ser. No. 14/092,077 is also a continuation-in-part under 37 C.F.R. §1.53(b) of U.S. patent application Ser. No. 13/767,754 filed on Feb. 14, 2013.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including bulk acoustic wave (BAW) resonators such as thin film bulk acoustic resonators (FBARs), coupled resonator filters (CRFs), stacked bulk acoustic resonators (SBARs), double bulk acoustic resonators (DBARs), and solidly mounted resonators (SMRs).

A typical acoustic resonator (e.g., an FBAR) comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

One metric used to evaluate the performance of an acoustic resonator is its electromechanical coupling coefficient ($kt^2$), which indicates the efficiency of energy transfer between the electrodes and the piezoelectric material. Other things being equal, an acoustic resonator with higher $kt^2$ is generally considered to have superior performance to an acoustic resonator with lower $kt^2$. Accordingly, it is generally desirable to use acoustic resonators with higher levels of $kt^2$ in high performance wireless applications, such as 4G and LTE applications.

The $kt^2$ of an acoustic resonator is influenced by several factors, such as the dimensions, composition, and structural properties of the piezoelectric material and electrodes. These factors, in turn, are influenced by the materials and manufacturing processes used to produce the acoustic resonator. Consequently, in an ongoing effort to produce acoustic resonators with higher levels of $kt^2$, researchers are seeking improved approaches to the design and manufacture of acoustic resonators.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
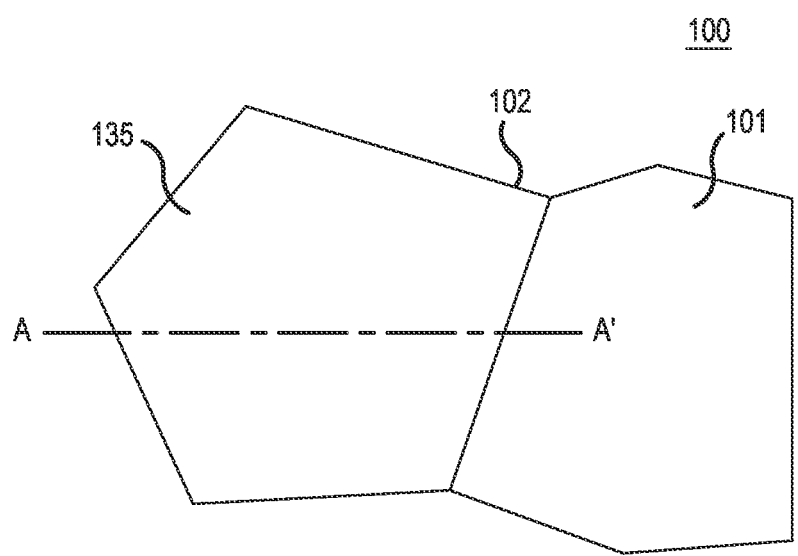
FIG. 1 is a top view of an acoustic resonator structure according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

The present teachings relate generally to acoustic resonators such as film bulk acoustic wave resonators (FBARs) or solidly mounted resonators (SMRs), although the discussion is directed to FBARs for the sake of convenience. Certain details of acoustic resonators, including materials and methods of fabrication, may be found in one or more of the following commonly owned U.S. Patents and Patent Applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Patent App. Pub. No. 2007/0205850 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. patent application Ser. No. 13/658,024 to Nikkel et al.; U.S. patent application Ser. No. 13/663,449 to Burak et al.; U.S. patent application Ser. No. 13/660,941 to Burak et al.; U.S. patent application Ser. No. 13/654,718 to Burak et al.; U.S. Patent App. Pub. No. 2008/0258842 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

In certain embodiments described below, an acoustic resonator structure comprises a first electrode disposed on a substrate, a piezoelectric layer disposed on the first electrode and comprising aluminum scandium nitride, a second electrode disposed on the piezoelectric layer, and a temperature compensation feature having a temperature coefficient offsetting at least a portion of a temperature coefficient of the piezoelectric layer, the first electrode, or the second electrode. The temperature compensation feature tends to reduce performance fluctuations due to changes in temperature, and the presence of scandium in the piezoelectric layer tends to compensate for a reduction in $kt^2$ that may result from the presence of the temperature compensation feature.

FIG. 1 is a top view of an acoustic resonator 100 according to a representative embodiment, and FIGS. 2 through 7 are cross-sectional views of acoustic resonator 100, taken along a line A-A' according to different embodiments. The cross-sectional views correspond to different variations of acoustic resonator 100 and will be referred to, respectively, as acoustic resonators 200 through 700. Acoustic resonators 200 through 700 have many of the same features, so a repetitive description of these features may be omitted in an effort to avoid redundancy.

Referring to FIG. 1, acoustic resonator 100 comprises a top electrode 135 having five (5) sides, with a connection side 101 configured to provide an electrical connection to interconnect 102. Interconnect 102 provides electrical signals to top electrode 135 to excite desired acoustic waves in a piezoelectric layer (not shown in FIG. 1) of acoustic resonator 100. The sides of acoustic resonator 100 have an apodized configuration, meaning that they all have different lengths. In addition, the sides are typically configured such that no two sides are parallel. In general, FBAR shape is not limited to five sides. For example, common alternative FBAR designs include quadrilaterals, pentagons, and other shapes. It can have the other shapes.

FIGS. 2 through 7 are cross-sectional diagrams illustrating acoustic resonators, according to representative embodiments. In the examples depicted in FIGS. 2 through 7, the acoustic resonator is an FBAR, for convenience of explanation. However, it is understood that other types of acoustic resonators may be included, without departing from the scope of the present teachings. Each of the acoustic resonators shown in FIGS. 2 through 7 comprises a piezoelectric layer comprising aluminum scandium nitride, as well as a temperature compensating feature (e.g., temperature compensating layer) located in or on an electrode or the piezoelectric layer of the acoustic stack. It is understood that the same general configurations may be included in acoustic resonators having additional structural features, without departing from the scope of the present teachings.

Referring to FIG. 2A, acoustic resonator 200, which may be an FBAR, for example, comprises a substrate 105 having a cavity 110 (e.g., air cavity), a bottom electrode 115t disposed on substrate 105 and cavity 110, a first planarization layer 120 disposed on substrate 105 adjacent to bottom electrode 115, a piezoelectric layer 125 disposed on bottom electrode 115t and first planarization layer 120, and a top electrode 135 disposed on piezoelectric layer 125. As depicted in FIG. 2B, a second planarization layer 201 may be disposed on piezoelectric layer 125 adjacent to top electrode 135, depending of placement of other optional structural features, such as collars. Collectively, bottom electrode 115t, piezoelectric layer 125, and top electrode 135 constitute an acoustic stack of acoustic resonator 200.

Acoustic resonator 200 further comprises a temperature compensating feature, indicated as a temperature compensating layer 117 in bottom electrode 115t, which compensates changes of the sound velocity and the cut-off frequency of piezoelectric layer 125 in response to changes in temperature. More particularly, bottom electrode 115t includes outside electrode layer 116, temperature compensating layer 117 and conductive interposer layer 118 (hereafter "interposer layer 118") stacked in this order on substrate 105. Interposer layer 118 separates temperature compensating layer 117 from piezoelectric layer 125, so that temperature compensating layer 117 is effectively buried or encapsulated within bottom electrode 115t. In other words, temperature compensating layer 117 is not formed on a top or bottom surface of bottom electrode 115t and is therefore separated from adjacent components (e.g., piezoelectric layer 125 and substrate 105) in the acoustic stack. In certain embodiments, temperature compensating layer 117 is disposed within a perimeter of cavity 110. For instance, it may have an edge located at a distance of about 0-2 microns from the perimeter of the air cavity, although this distance can be modified. Alternatively, one or both edges of temperature compensating layer 117 may be disposed outside the perimeter of cavity 100.

The presence of first planarization layer 120 is not necessary. For instance, in certain alternative embodiments, first planarization layer 120 may be omitted, and temperature compensation layer 117 is taper etched and buried in interposer electrode 118 and outside electrode layer 116, as illustrated by acoustic resonator 300 in FIG. 3.

The presence of interposer layer 118 is not necessary, although it facilitates proper growth of piezoelectric layer 125 and otherwise provides protection of temperature compensating layer 117 (e.g., from hydrofluoric acid (HF)) used for wet etching or wet release process) during the fabrication process. Also, the presence and thickness of interposer layer 118 affect temperature compensation effects of temperature compensating layer 117. In addition, a thick enough interposer layer 118 made of low sheet resistance metal, for example, may electrically short temperature compensating layer 117, therefore eliminating its series capacitance and possibly increasing electromechanical coupling coefficient $kt^2$. On the other hand, a relatively thick interposer layer 118 may acoustically imbalance the stack by forming a low acoustic energy density region (interposer layer 118) separating two high acoustic energy density regions (temperature compensating layer 117 and piezoelectric layer 125) which in turn may cause increased loss to acoustic radiation mechanism and decreased quality factor-Q and parallel resistance Rp. Various illustrative temperature compensating layers and fabrication techniques are described by U.S. patent application Ser. No. 13/766,993 (filed Feb. 14, 2013), to Burak et al., which is hereby incorporated by reference in its entirety.

The relative thicknesses of outside electrode layer 116 and interposer layer 118 and/or temperature compensating layer 117 may be varied, without departing from the scope of the present teachings. For example, the thickness of interposer layer 118 may be increased, thus "sinking" temperature compensating layer 117 deeper into bottom electrode 115t (and further away from the active piezoelectric layer 125). Generally, the thickness and location of temperature compensating layer 117, as well as the thicknesses of outside electrode layer 116 and interposer layer 118, within bottom electrode 115t should be optimized in order to maximize the coupling coefficient for an allowable linear temperature coefficient. This optimization may be accomplished, for example, by modeling an equivalent circuit of the acoustic stack using a Mason model, as would be apparent to one of ordinary skill in the art. Although there is some degradation in the offsetting effects of the temperature coefficient by sinking temperature compensating layer 117, the coupling coefficient of acoustic resonator 200 may be improved. An algorithm may be developed to optimize the depth of temperature compensating layer 117 in bottom electrode 115t in light of the trade-off between the temperature coefficient and the coupling coefficient, for example, using a multivariate optimization technique, such as a Simplex method, as would be apparent to one of ordinary skill in the art. In addition, the depth of temperature compensating layer 117 may be limited by various constraints, such as minimum necessary coupling coefficient and maximum allowable temperature coefficient. Likewise, the thickness of the temperature compensating layer 117 may be adjusted to provide the optimal coupling coefficient and a minimum overall temperature coefficient of acoustic resonator 200. Such optimization and corresponding considerations regarding temperature compensating layers are also applicable to the other FBARs discussed herein (e.g., acoustic resonators 300 and 400, discussed below).

Figure 2:
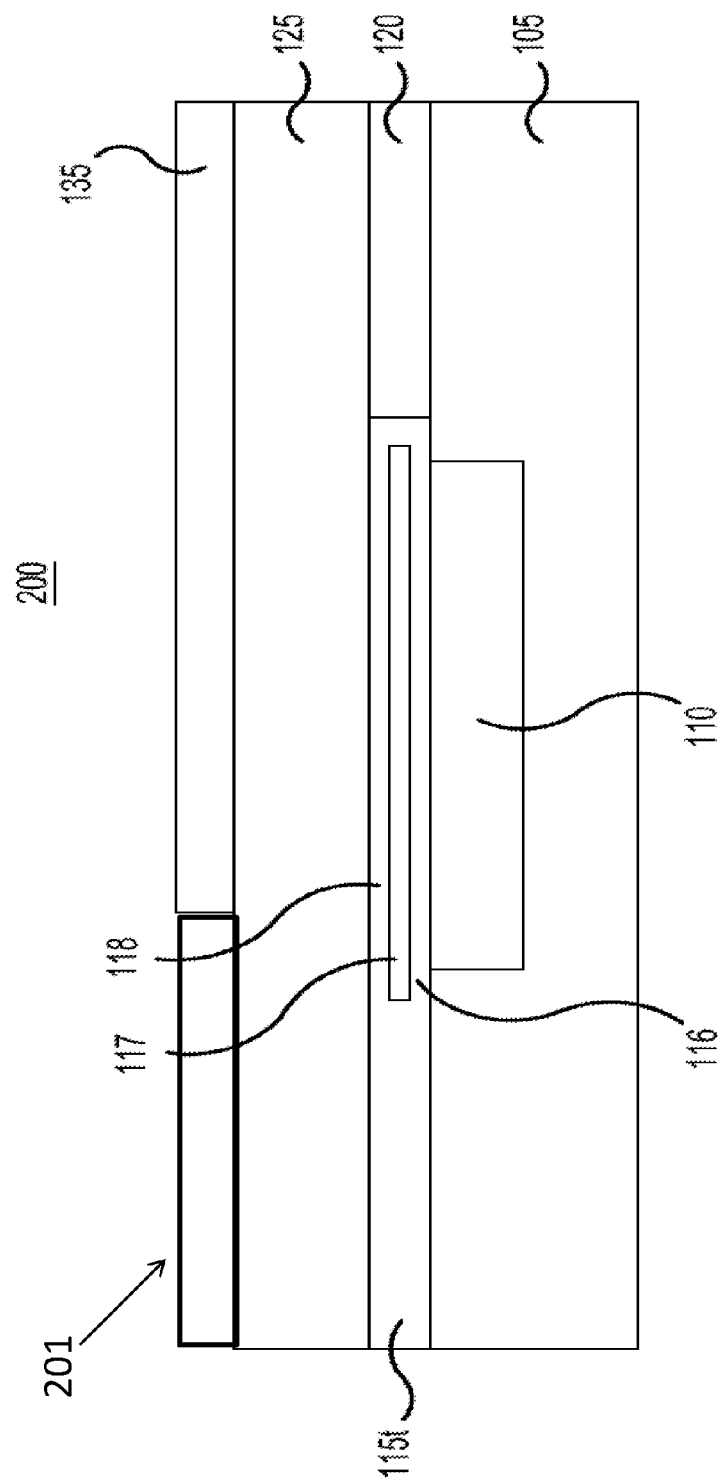
FIG. 2A is a cross-sectional view of an acoustic resonator structure according to a representative embodiment.
FIG. 2B is a cross-sectional view of an acoustic resonator structure according to a representative embodiment.
Figure 3:
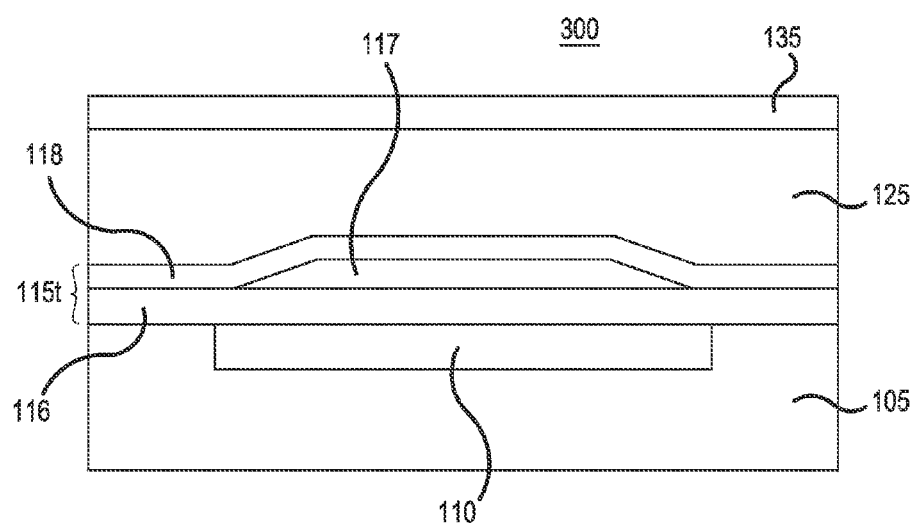
FIG. 3 is a cross-sectional view of an acoustic resonator structure according to another representative embodiment.

As shown in FIG. 2, the encapsulated temperature compensating layer 117 is surrounded by outside electrode layer 116 and interposer layer 118. An example of encapsulating temperature compensating layer 117 is described in more detail by U.S. patent application Ser. No. 13/766,993 (filed Feb. 14, 2013), to Burak et al., which is hereby incorporated by reference in its entirety. However, in alternative embodiments, temperature compensating layer 117 may not be encapsulated, or may be partially encapsulated, such that at least a portion of temperature compensating layer 117 is exposed at one or more edges (top, bottom or side) of bottom electrode 115t. For example, temperature compensating layer 117 may extend the entire width (horizontal direction in the depicted orientation) of bottom electrode 115t. Also, for example, a surface of temperature compensating layer 117 may abut a surface of piezoelectric layer 125, that is, when interposer layer 118 is not present.

In bottom electrode 115t, outside electrode layer 116 and interposer layer 118 may be formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example. In the depicted embodiment, outside electrode layer 116 and the interposer layer are formed of the same conductive material (e.g., Mo). However, in various alternative embodiments, outside electrode layer 116 and interposer layer 118 may be formed of different conductive materials, where outside electrode layer 116 is formed of a material having relatively lower conductivity and relatively higher acoustic impedance, and interposer layer 118 is formed of a material having relatively higher conductivity and relatively lower acoustic impedance. For example, outside electrode layer 116 may be formed of W and interposer layer 118 may be formed of Mo, although other materials and/or combinations of materials may be used without departing from the scope of the present teachings.

Temperature compensating layer 117 may be formed of various materials compatible with semiconductor processes, including boron silicate glass (BSG), silicon dioxide ($SiO_2$), chromium (Cr) or tellurium oxide (TeO(x)), for example, which have positive temperature coefficients. The positive temperature coefficient of temperature compensating layer 117 offsets negative temperature coefficients of other materials in the acoustic stack, including piezoelectric layer 125, top electrode 135, and the outside electrode and interposer layers 116 and 118 of bottom electrode 115t.

Substrate 105 may be formed of a material compatible with semiconductor processes, such as silicon (Si), gallium arsenide (GaAs), indium phosphide (InP), glass, sapphire, alumina, or the like, for example. Various illustrative fabrication techniques for an air cavity in a substrate are described by U.S. Pat. No. 7,345,410 (Mar. 18, 2008), to Grannen et al., which is hereby incorporated by reference in its entirety. Piezoelectric layer 125 may be formed of any piezoelectric material compatible with semiconductor processes, such as aluminum nitride (AlN), zinc oxide (ZnO), or zirconate titanate (PZT), for example. Moreover, as explained below, the piezoelectric material may be combined with at least one rare earth element, such as scandium (Sc), yttrium (Y), lanthanum (La), erbium (Er), or ytterbium (Yb).

First planarization layer 120 may be formed of borosilicate glass (BSG), for example. First planarization layer 120 is not strictly required for the functioning of acoustic resonator 200, but its presence can confer various benefits. For instance, the presence of first planarization layer 120 tends to improve the structural stability of acoustic resonator 200, may improve the quality of growth of subsequent layers, and may allow bottom electrode 115$t$ to be formed without its edges extending beyond cavity 110. The presence of first planarization layer 120 also tends to avoid the taper of the bottom electrode and poor ALN growth quality on top of the bottom electrode slope due to bottom electrode taper etching. Further examples of potential benefits of planarization are presented in U.S. Patent App. Pub. No. 2013/0106534 to Burak et al., which is hereby incorporated by reference in its entirety. Bottom and top electrodes 115$t$ and 135 may be formed of one or more electrically conductive metal materials, such as tungsten (W), molybdenum (Mo), copper (Cu) or aluminum (Al). Bottom and top electrodes 115$t$ and 135 electrodes may be formed of the same or different materials. Of course, other materials may be incorporated into the above and other features of acoustic resonator 200 without departing from the scope of the present teachings.

Figure 4:
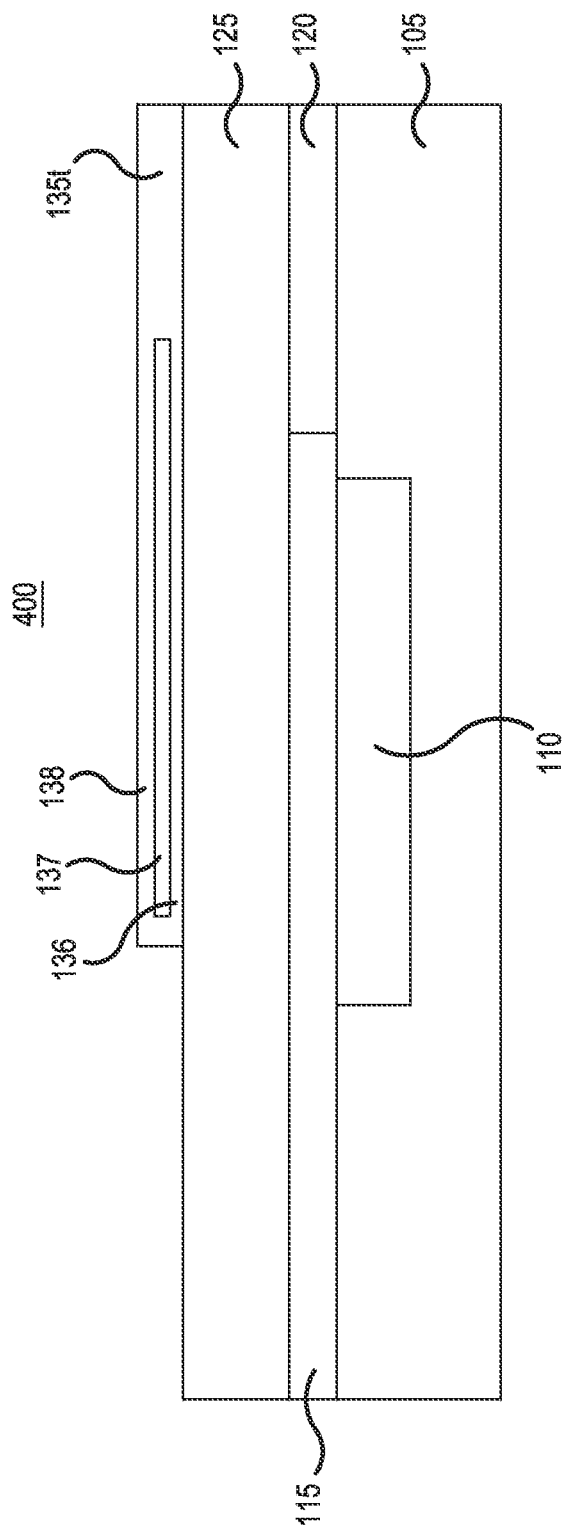
FIG. 4 is a cross-sectional view of an acoustic resonator structure according to still another representative embodiment.

Referring to FIG. 4, acoustic resonator 400 is similar to acoustic resonator 200, except for placement of the temperature compensating feature, which is depicted as temperature compensating layer 137 in top electrode 135$t$. That is, the acoustic resonator 400 comprises substrate 105 having cavity 110, bottom electrode 115 disposed over substrate 105 and cavity 110, first planarization layer 120 disposed on substrate 105 adjacent to bottom electrode 115, piezoelectric layer 125 disposed on bottom electrode 115 and first planarization layer 120, and top electrode 135$t$, including temperature compensating layer 137, disposed on piezoelectric layer 125.

Top electrode 135$t$ comprises conductive interposer layer 136 (hereinafter "interposer layer 136"), temperature compensating layer 137 and outside electrode layer 138, stacked in this order on piezoelectric layer 125. Interposer layer 136 separates temperature compensating layer 137 from piezoelectric layer 125. Although the presence of an interposer layer 136 is not necessary, particularly since it is not required to assist growth of piezoelectric layer 125, it provides protection of temperature compensating layer 137 (e.g., from HF used for wet etching) during the fabrication process, and otherwise influences the temperature compensation effects of temperature compensating layer 137. In alternative embodiments, interposer layer 136 is not included, and thus temperature compensating layer 137 is formed directly on the top surface of piezoelectric layer 125. Also, although temperature compensating layer 137 is shown encapsulated within top electrode 135$t$, it is understood that it may extend the entire width of top electrode 135$t$, or otherwise be only partially encapsulated within top electrode 135$t$, without departing from the scope of the present teachings. Also, for example, a surface of temperature compensating layer 137 may abut a surface of piezoelectric layer 125, that is, where interposer layer 136 is not present, as mentioned above.

In top electrode 135$t$, the interposer and outside electrode layers 136 and 138 may be formed of the same or different electrically conductive materials, as discussed above with regard to outside electrode and interposer layers 116 and 118. In an embodiment, the outside electrode layer 138 may be formed of a material having relatively lower conductivity and relatively higher acoustic impedance, and interposer layer 136 may be formed of a material having relatively higher conductivity and relatively lower acoustic impedance. For example, the outside electrode layer 138 may be formed of W and interposer layer 136 may be formed of Mo, although other materials and/or combinations of materials may be used without departing from the scope of the present teachings. Temperature compensating layer 137 may be formed of various materials compatible with semiconductor processes, including BSG, $SiO_2$, Cr or TeO(x), for example, which have positive temperature coefficients.

Figure 5:
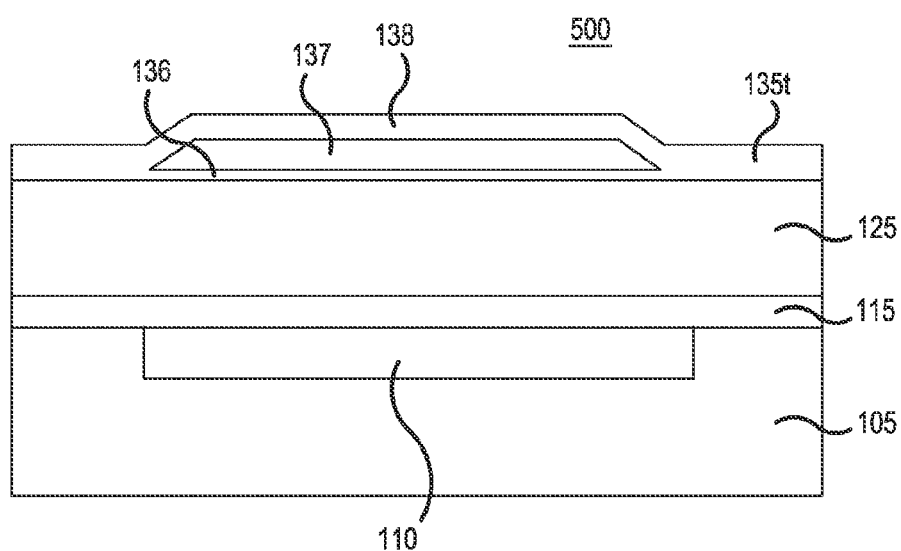
FIG. 5 is a cross-sectional view of an acoustic resonator structure according to still another representative embodiment.

Referring to FIG. 5, acoustic resonator 500 is similar to acoustic resonator 400, except that it omits first planarization layer 120, and temperature compensating layer 137 is taper etched, similar to acoustic resonator 300.

Figure 6:
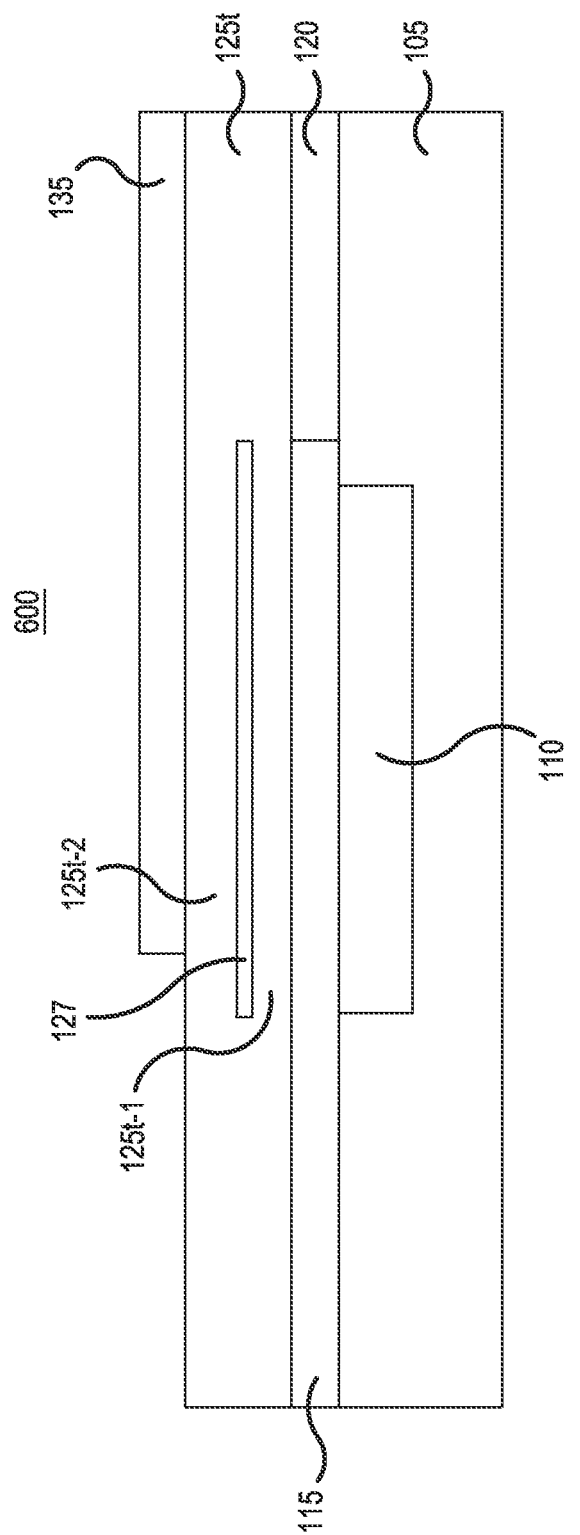
FIG. 6 is a cross-sectional view of an acoustic resonator structure according to still another representative embodiment.

Referring to FIG. 6, acoustic resonator 600 is similar to acoustic resonator 200, except for the placement of the temperature compensating feature, which is depicted as temperature compensating layer 127 in piezoelectric layer 125$t$. That is, acoustic resonator 600 comprises substrate 105 having cavity 110, bottom electrode 115 disposed over substrate 105 and cavity 110, first planarization layer 120 disposed on substrate 105 adjacent to bottom electrode 115, piezoelectric layer 125$t$, including temperature compensating layer 127, disposed on bottom electrode 115 and first planarization layer 120, and top electrode 135 disposed on piezoelectric layer 125$t$.

Piezoelectric layer 125$t$ comprises a first piezoelectric sub-layer 125$t$-1, temperature compensating layer 127 and second piezoelectric sub-layer 125$t$-2, stacked in this order on bottom electrode 115. Thus, in the depicted embodiment, temperature compensating layer 127 is buried in piezoelectric layer 125$t$. In other words, temperature compensating layer 127 is not formed on a top or bottom surface of piezoelectric layer 125$t$ and is therefore separated from adjacent components (e.g., bottom and top electrodes 115 and 135) in the acoustic stack. In the depicted embodiment, temperature compensating layer 127 is positioned approximately half way through the total thickness of piezoelectric layer 125$t$, for example. First piezoelectric sub-layer 125$t$-1 and second piezoelectric sub-layer 125$t$-2 of piezoelectric layer 125$t$ may be formed of the same material, with temperature compensating layer 127 formed in between. Temperature compensating layer 127 may be formed of various materials compatible with semiconductor processes, including BSG, $SiO_2$, Cr or TeO(x), for example, which have positive temperature coefficients. The positive temperature coefficient of temperature compensating layer 127 offsets negative temperature coefficients of other materials in the acoustic stack, including piezoelectric layer 125$t$, and the bottom and top electrodes 115 and 135. Also, although temperature compensating layer 127 is shown encapsulated within piezoelectric layer 125$t$, it is understood that it may extend the entire width of piezoelectric layer 125$t$, or otherwise be only partially encapsulated within piezoelectric layer 125$t$, without departing from the scope of the present teachings. Also, for example, a surface of temperature compensating layer 127 may abut a surface of one of bottom electrode 115 or top electrode 135. In addition, similar to the acoustic resonators 200 through 500, temperature compensating layer 127 may be encapsulated in metal layers placed below, above, or on both sides of temperature compensating layer 127, without departing of the scope of the present teachings.

Figure 7:
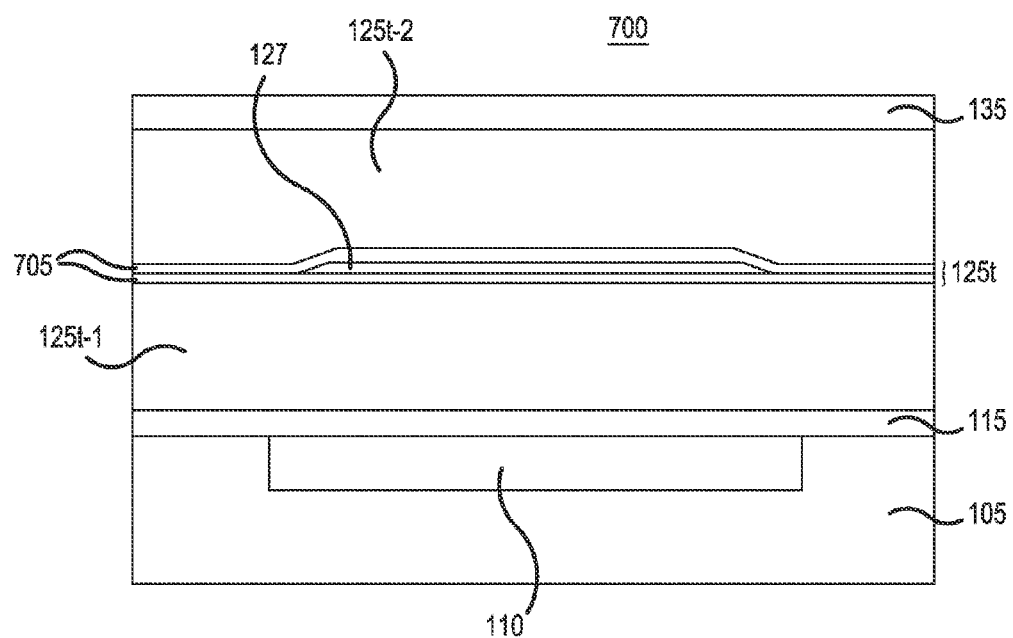
FIG. 7 is a cross-sectional view of an acoustic resonator structure according to still another representative embodiment.

Referring to FIG. 7, acoustic resonator 700 is similar to acoustic resonator 600, except that first planarization layer 120 is omitted, temperature compensating layer 127 is taper etched, and encapsulated in metal layers 705.

Generally, the addition of a temperature compensating layer, such as representative temperature compensating layers 117, 127 and/or 137 in acoustic resonators 100 through 700 will decrease the electromechanical coupling coefficient $kt^2$ of the corresponding acoustic resonator device. In order to compensate, piezoelectric layer 125, 125*t* may be formed of materials with intrinsically higher piezoelectric coupling coefficient (e.g., ZnO instead of AlN). Also, in various embodiments, piezoelectric layer 125, 125*t* may be "doped" with one or more rare earth elements, such as scandium (Sc), yttrium (Y), lanthanum (La), erbium (Er), or ytterbium (Yb), for example, to increase the piezoelectric coupling coefficient $e_{33}$ in piezoelectric layer 125, 125*t*, thereby off-setting at least a portion of the degradation of the electromechanical coupling coefficient $kt^2$ of the acoustic resonator caused by temperature compensating layer 117, 127 or 137. Examples of doping piezoelectric layers with one or more rare earth elements for improving electromechanical coupling coefficient $kt^2$ are provided by U.S. patent application Ser. No. 13/662,425 filed Oct. 27, 2012, by Bradley et al., and U.S. patent application Ser. No. 13/662,460 filed Oct. 27, 2012, by Grannen et al., which are hereby incorporated by reference in their entireties.

In addition to compensating for a reduction of $kt^2$ due to a temperature compensation material, a piezoelectric layer that has been "doped" with a material such as scandium may provide several additional benefits compared to conventional piezoelectric layers. For example, the aluminum scandium nitride tends to reduce acoustic velocity, which may allow improved performance or scaling down in thickness of all resonator layers to get back to the same frequency (and concurrent resonator area reduction). Also, the aluminum scandium nitride tends to have a higher dielectric constant, allowing further resonator area reduction for the same total impedance. Moreover, proportionally thicker electrodes tend to provide improved Q-factor, which tends to reduce insertion loss. This can be used for better performance or scaling down the effective $kt^2$ by thinning the piezoelectric layers even further for additional die shrinking. In general, the magnitude of these and other potential benefits may vary according to the amount of scandium in the piezoelectric layer 125. In certain embodiments, as indicated above, a piezoelectric layer may comprise aluminum scandium nitride with about 3-10 wt % scandium.

While example embodiments are disclosed herein, one of ordinary skill in the art appreciates that many variations that are in accordance with the present teachings are possible and remain within the scope of the appended claims. For instance, as indicated above, the location, dimensions, and materials of a collar and/or frames can be variously altered. In addition, other features can be added and/or removed to further improve various performance characteristics of the described devices. These and other variations would become clear to one of ordinary skill in the art after inspection of the specification, drawings and claims herein. The invention therefore is not to be restricted except within the spirit and scope of the appended claims.

The invention claimed is:

1. An acoustic resonator structure, comprising:
a first electrode disposed on a substrate;
a piezoelectric layer disposed on the first electrode and comprising aluminum scandium nitride;
a second electrode disposed on the piezoelectric layer; and
a temperature compensation feature having a temperature coefficient offsetting at least a portion of a temperature coefficient of the piezoelectric layer, the first electrode, or the second electrode; and
a planarization layer disposed over the substrate and abutting the first electrode, the planarization layer being substantially flush with the first electrode.

2. The acoustic resonator structure of claim 1, wherein the aluminum scandium nitride comprises about 3-10 wt % scandium.

3. The acoustic resonator structure of claim 1, wherein the temperature compensation feature comprises silicon oxide.

4. The acoustic resonator structure of claim 1, wherein the temperature compensation feature comprises a temperature compensation layer disposed between the first electrode and the piezoelectric layer.

5. The acoustic resonator structure of claim 4, further comprising an interposer layer formed over the temperature compensation layer and in contact with the first electrode.

6. The acoustic resonator structure of claim 1, wherein the temperature compensation feature comprises a temperature compensation layer disposed on the second electrode.

7. The acoustic resonator structure of claim 6, further comprising an interposer layer formed over the temperature compensation layer and in contact with the second electrode.

8. The acoustic resonator structure of claim 1, wherein the temperature compensation feature comprises a temperature compensation layer embedded within the piezoelectric layer.

9. The acoustic resonator structure of claim 8, further comprising a first interposer layer formed over the temperature compensation layer, and a second interposer layer formed under the temperature compensation layer.

10. The acoustic resonator structure of claim 1, further comprising an air cavity disposed in the substrate, wherein the temperature compensation feature is disposed within a perimeter of the air cavity.

11. The acoustic resonator structure of claim 10, wherein the temperature compensation feature has an edge located at a distance of about 0-2 microns from the perimeter of the air cavity.

12. The acoustic resonator structure of claim 1, wherein the temperature coefficient of the temperature compensation feature is a positive temperature coefficient and the temperature coefficient of the piezoelectric layer, the first electrode, and the second electrode is a negative temperature coefficient.

13. An acoustic resonator structure, comprising:
a first electrode disposed on a substrate;
a piezoelectric layer disposed on the first electrode and comprising a piezoelectric material combined with at least one rare earth element;
a second electrode disposed on the piezoelectric layer;
a temperature compensation feature having a temperature coefficient offsetting at least a portion of a temperature coefficient of the piezoelectric layer, the first electrode, or the second electrode; and
a planarization layer disposed over the substrate and abutting the first electrode, the planarization layer being substantially flush with the first electrode.

14. The acoustic resonator structure of claim 13, wherein the at least one rare earth element comprises scandium (Sc).

15. The acoustic resonator structure of claim 13, wherein the at least one rare earth element comprises at least one of ytterbium (Yb), yttrium (Y), lanthanum (La), and erbium (Er).

16. The acoustic resonator structure of claim 13, wherein the piezoelectric layer comprises about 3-10 wt % of the at least one rare earth element.

17. The acoustic resonator structure of claim 13, wherein the temperature compensation feature comprises at least one of boron silicate glass (BSG), silicon dioxide ($SiO_2$), chromium (Cr) and tellurium oxide (TeO(x)).

18. The acoustic resonator structure of claim 13, wherein the temperature compensation feature comprises a temperature compensation layer disposed between the first electrode and the piezoelectric layer.

19. The acoustic resonator structure of claim 13, wherein the temperature compensation feature comprises a temperature compensation layer disposed on the second electrode.

20. The acoustic resonator structure of claim 13, wherein the temperature compensation feature comprises a temperature compensation layer embedded within the piezoelectric layer.

21. The acoustic resonator structure of claim 1, wherein the planarization layer is a first planarization layer, and the acoustic resonator structure further comprises a second planarization layer disposed over the piezoelectric layer and abutting the second electrode, the planarization layer being substantially flush with the second electrode.

22. The acoustic resonator structure of claim 1, wherein ends of the temperature compensation feature are tapered.

23. The acoustic resonator structure of claim 13, wherein the planarization layer is a first planarization layer, and the acoustic resonator structure further comprises a second planarization layer disposed over the piezoelectric layer and abutting the second electrode, the planarization layer being substantially flush with the second electrode.

* * * * *